(12) United States Patent
Choi et al.

(10) Patent No.: US 8,293,020 B2
(45) Date of Patent: Oct. 23, 2012

(54) METHOD OF MEGASONIC CLEANING OF AN OBJECT

(75) Inventors: Jae-Hyuck Choi, Yongin-si (KR);
Won-Jung Kim, Seoul (KR); Ho-Young Kim, Seoul (KR); Hyung-Ho Ko, Hwaseong-si (KR); Jong-Keun Oh, Seoul (KR); Chan-Uk Jeon, Seongnam-si (KR); Keun-Hwan Park, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/907,642

(22) Filed: Oct. 19, 2010

(65) Prior Publication Data

US 2011/0297182 A1    Dec. 8, 2011

(30) Foreign Application Priority Data

Jun. 3, 2010  (KR) ......................... 10-2010-0052109

(51) Int. Cl.
*B08B 3/12*    (2006.01)
(52) U.S. Cl. .................... 134/1; 134/2; 134/15; 134/26; 134/30; 134/32; 134/34; 134/36; 134/37; 134/42; 134/902
(58) Field of Classification Search .................. 134/1, 2, 134/15, 26, 30, 32, 34, 36, 37, 42, 902
See application file for complete search history.

(56) References Cited

U.S. PATENT DOCUMENTS

| 3,893,869 | A | * | 7/1975 | Mayer et al. | 134/86 |
| 4,909,266 | A | * | 3/1990 | Massa | 134/60 |
| 5,501,240 | A | * | 3/1996 | Dohku et al. | 134/61 |
| 5,810,037 | A | * | 9/1998 | Sasaki et al. | 134/111 |
| 2008/0142055 | A1 | * | 6/2008 | Yin et al. | 134/95.1 |

FOREIGN PATENT DOCUMENTS

| JP | 2009-125645 A | 6/2009 |
| KR | 10-0551413 B1 | 2/2005 |
| KR | 10-2005-0100405 | 10/2005 |
| KR | 10-2006-0058228 | 5/2006 |

OTHER PUBLICATIONS

Wikipedia, the Free Encyclopedia, p. 1, Nov. 13, 2011, "Cavitation".*
Kim et al., "Visualzation and minimization of disruptive bubble behavior in ulatrsonic field", Ultrasonics (2010), doi:10.1016/j.ultras.2010.04.002.

* cited by examiner

*Primary Examiner* — Bibi Carrillo
(74) *Attorney, Agent, or Firm* — Harness, Dickey & Pierce, P.L.C.

(57) ABSTRACT

A megasonic cleaning method and a megasonic cleaning apparatus are provided. Microcavitation bubbles may be formed by applying an electromotive force to a cleaning solution using a megasonic energy in a separate room from an object to be cleaned. The microcavitation bubbles having a stable oscillation among the formed microcavitation bubbles may be moved to the object to be cleaned. A surface of the object to be cleaned may be cleaned using the microcavitation bubbles having the stable oscillation. Particles attached onto the surface of the object to be cleaned may be effectively removed while preventing pattern damage.

9 Claims, 9 Drawing Sheets

METHOD OF MEGASONIC CLEANING OF AN OBJECT

CROSS-REFERENCE TO RELATED APPLICATIONS

This application claims priority under 35 USC §119 to Korean Patent Application No. 10-2010-0052109, filed on Jun. 3, 2010 in the Korean Intellectual Property Office (KIPO), the contents of which are herein incorporated by reference in their entirety.

BACKGROUND

1. Field

Example embodiments relate to a method of megasonic cleaning of an object and an apparatus for performing the same. More particularly, example embodiments relate to a method of megasonic cleaning of semiconductor substrates and photomasks and an apparatus for performing the same.

2. Description of the Related Art

Generally, a megasonic cleaning mechanism is used in a semiconductor manufacturing process, particularly, it is used in a cleaning process of semiconductor substrates and photomasks. According to the megasonic cleaning mechanism, acoustic energy is applied to liquid medium to rapidly form and collapse minute bubbles of gases dissolved in the medium to eliminate adhesion force of particles to the semiconductor substrates and the photo masks and to remove the particles there from. When radio frequency (RF) power is applied to a piezoelectric transducer, the particles also may be removed due to fluid kinetics induced by acoustic waves through fluid.

However, patterns formed on the semiconductor substrates and the photomasks may be damaged during the particle removing process. When the power is reduced or frequency is increased to prevent the pattern damages, cleaning efficiency may be reduced.

SUMMARY

Example embodiments provide a method of megasonic cleaning of an object, capable of restraining the pattern damages on semiconductor substrates and photomasks and improving cleaning efficiency.

Example embodiments provide an apparatus for performing the megasonic cleaning method.

In accordance with example embodiments, a method of megasonic cleaning may include forming microcavitation bubbles in a first room by applying an electromotive force to a cleaning solution using a megasonic energy, the microcavitation bubbles including stable and unstable bubbles, moving the cleaning solution having the microcavitation bubbles out of the first room and to an object to be cleaned, and cleaning a surface of the object to be cleaned using the cleaning solution and the stable bubbles.

In accordance with example embodiments, an apparatus for megasonic cleaning may include a bubble generating part, a cleaning part, and a loading part. The bubble generating part may be configured to generate microcavitation bubbles that include stable and unstable bubbles by applying an electromotive force to a cleaning solution using a megasonic energy and including a container having an inlet line through which the cleaning solution enters the bubble generating part and an outlet line through which at least one of the cleaning solution, the stable bubbles, and the unstable bubbles pass. The cleaning part may be configured to receive the cleaning solution and the stable bubbles from the outlet line, the cleaning part being further configured to clean an object to be cleaned using the cleaning solution and the stable bubbles, the cleaning part being provided separately from the bubble generating part. The loading part may be configured to load the object to be cleaned to clean the object using the cleaning solution and the stable bubbles.

According to example embodiments, there is provided a method of megasonic cleaning. In the method, microcavitation bubbles are generated by applying electromotive force to a cleaning solution using megasonic energy in a separate room from an object to be cleaned. The microcavitation bubbles having a stable oscillation among the formed microcavitation bubbles move to the object to be cleaned. A surface of the object to be cleaned is cleaned using the microcavitation bubbles having a stable oscillation.

In example embodiments, when the microcavitation bubbles having a stable oscillation are moved, the microcavitation bubbles may be controlled, so that the microcavitation bubbles having an unstable oscillation may be collapsed or removed, thereby preventing the microcavitation bubbles having an unstable oscillation from reaching the room where the object to be cleaned is loaded.

In example embodiments, there may be further included a process for providing a high frequency oscillation to a room where the object to be cleaned may be loaded, so that the microcavitation bubbles, which have moved to the room, may maintain their stable oscillation state.

In example embodiments, a first power may be applied for producing the microcavitation bubbles in the separate room and a second power may be applied for maintaining a stable oscillation of the microcavitation bubbles in the room where the object to be cleaned may be provided.

In example embodiments, the first power may be higher than the second power.

In example embodiments, the second power may be less than 50% of the first power.

In example embodiments, both of the microcavitation bubbles having a stable oscillation and the microcavitation bubbles having an unstable oscillation may be formed by the first power.

According to example embodiments, there is provided an apparatus for megasonic cleaning. The apparatus includes a bubble generating part for generating microcavitation bubbles by applying electromotive force to a cleaning solution using megasonic energy, and the bubble generating part includes a container having an inlet line and an outlet line of the cleaning solution. The apparatus also includes a cleaning part for receiving the cleaning solution that drains through the outlet line and the microcavitation bubbles having a stable oscillation and for cleaning an object to be cleaned using the microcavitation bubbles having a stable oscillation. The cleaning part is provided at a separate place from the bubble generating part. The apparatus includes a loading part for loading the object to be cleaned for cleaning the object using the microcavitation bubbles having a stable oscillation.

In example embodiments, the bubble generating part may include a first piezoelectric transducer for generating the microcavitation bubbles and the cleaning part may include a second piezoelectric transducer for maintaining the stable oscillation of the microcavitation bubbles.

In example embodiments, the bubble generating part may be provided in a separate room within the cleaning part or at an outside of the cleaning part.

In example embodiments, the bubble generating part may be provided in a separate room within the cleaning part and the cleaning part may include a tank including the cleaning solution and the second piezoelectric transducer.

In example embodiments, the loading part may be provided within the cleaning part.

In example embodiments, the bubble generating part may be provided at an outside of the cleaning part and the cleaning part may be a space between the bubble generating part and the loading part.

In example embodiments, the second piezoelectric transducer facing the loading part may be provided on an outer wall of the bubble generating part.

In example embodiments, a particle outlet line may be provided for draining out the cleaning solution including particles. The particle outlet line may be provided along an outer wall of the container of the bubble generating part and guides the cleaning solution to fill up the cleaning part.

In example embodiments, the inlet line of the cleaning solution may be extended from an outer portion of the cleaning part to an inner portion of the container of the bubble generating part, and the outlet line of the cleaning solution may be extended from the inner portion of the container of the bubble generating part to the cleaning part.

In example embodiments, the first piezoelectric transducer may be provided in parallel or in perpendicular direction with respect to an extended direction of the inlet line of the cleaning solution of the bubble generating part.

In example embodiments, the second piezoelectric transducer may be provided in parallel or in perpendicular direction with respect to an extended direction of the outlet line of the cleaning solution of the bubble generating part.

In example embodiments, the loading part may make a horizontal rotation or a horizontal and rectilinear movement.

According to example embodiments, the pattern damages of an object to be cleaned may be minimized while removing attached particles from the object to be cleaned. In particular, the particles attached on photomasks may be removed without damaging patterns formed on the object, thereby preventing repeated generation of pattern damages on substrates due to the attached particles on the photomasks. Thus, manufacturing yield of semiconductor devices may be increased.

BRIEF DESCRIPTION OF THE DRAWINGS

Example embodiments will be more clearly understood from the following detailed description taken in conjunction with the accompanying drawings. FIGS. 1 to 9F represent non-limiting, example embodiments as described herein.

FIG. 1 is a flow chart illustrating a method of megasonic cleaning with respect to an object to be cleaned.

FIG. 2 is a cross-sectional view of an apparatus for performing a megasonic cleaning in accordance with a first example embodiment.

FIG. 3 is a cross-sectional view of an apparatus for performing a megasonic cleaning in accordance with a second example embodiment.

FIG. 5 is a cross-sectional view of an apparatus for performing a megasonic cleaning in accordance with a third example embodiment.

FIG. 6 is a cross-sectional view of an apparatus for performing a megasonic cleaning in accordance with a fourth example embodiment.

FIG. 7 illustrates a graph showing a removing efficiency of particles in accordance with acoustic pressure.

FIG. 8 illustrates a bar graph showing a removing efficiency of particles in accordance with various embodiments.

FIGS. 9A to 9F are fluorescent images of particles attached on photomasks taken after performing megasonic cleaning in accordance with various embodiments.

DETAILED DESCRIPTION OF THE EMBODIMENTS

Figure 1:
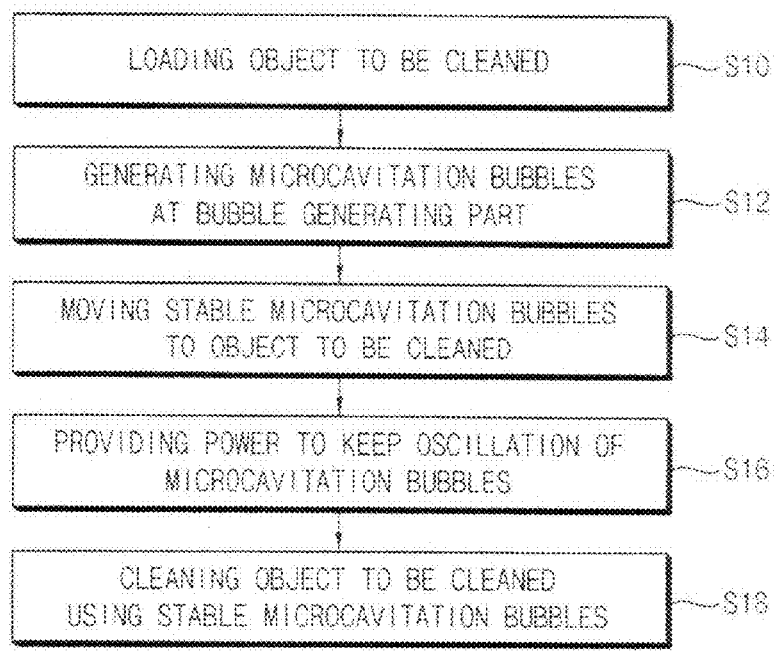

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments on methods of megasonic cleaning will be explained in detail.

Megasonic cleaning may be performed by transferring energy generated from a megasonic generator to a fluid body. The main mechanism of the megasonic cleaning may include microcavitation, acoustic streaming, acoustic pressure gradient, pressure enhanced chemical effects, etc. The cavitation may be defined by rapid formation of minute bubbles from gases dissolved in fluid body through an application of acoustic energy and collapse of the minute bubbles. The acoustic streaming may represent fluid kinetics induced by acoustic waves through the fluid body when radio frequency (RF) power is applied onto piezoelectric transducer. The microcavitation may be a main factor in the megasonic cleaning and damage generation.

Repeated enlargement and reduction of the microcavitation bubbles makes an oscillation. Detachment torque due to gas/liquid interface sweeping may be applied onto the particles nearby the oscillation, to thereby detach the particles. The particles far from the oscillation may be removed by pressure-gradient forces generated from surrounding liquid maintaining the oscillation due to the oscillating cavitation.

In a middle megasonic power region, patterns may be damaged by implosion of the microcavitation bubbles. That is, when pressure near the cavitations loses symmetrical characteristic in the middle megasonic power region and is severely deformed, the cavitations may be imploded and vigorous flowing may be generated to damage the patterns. In a high megasonic power region, a pattern may be damaged due to the chaotic oscillation of the cavitations.

The patterns may be cleaned by a stable and periodic oscillation of the microcavitation bubbles. That is, particles may be removed from the patterns by the stable and periodic oscillation of the microcavitation bubbles. In example embodiments, the patterns may be cleaned only by the oscillation of the microcavitation bubbles. That is, particles may be removed from the patterns only by the action of the oscillation of the microcavitation bubbles. However, the patterns may be damaged by unstable and irregular behavior of the microcavitation bubbles including the implosion and non-linear behavior of the microcavitation bubbles. Therefore, the patterns may be effectively cleaned without damaging the patterns by using the stable microcavitation bubbles. That is, particles may be effectively removed from the patterns without damaging the patterns by using the stable microcavitation bubbles.

In accordance with example embodiments, stable microcavitation bubbles and unstable microcavitation bubbles may be separated. The unstable microcavitation bubbles may be removed and only the stable microcavitation bubbles may be used to perform the megasonic cleaning.

FIG. 1 is a flow chart illustrating a method of megasonic cleaning of an object to be cleaned.

An object to be cleaned may be loaded (Step S10). For example, the object to be cleaned may be loaded on a loading part of a megasonic cleaning apparatus. The object to be cleaned may be a semiconductor substrate or a photomask. Chips may be on the semiconductor substrate and the chips on the semiconductor substrate may be manufactured by using the photomask. In the manufacturing process, particles may be produced and attached to the chips or the photomask. These particles may generate a defect in the mask or the chips. Accordingly, removing the attached particles, especially from the photomask, may be required.

The object to be cleaned may be loaded in a tank including a cleaning solution. Alternatively, the object to be cleaned may be loaded on a loading part that is not immersed in the cleaning solution but exposed to the air.

Electromotive force may be applied to the cleaning solution in a bubble generating part to generate microcavitation bubbles for cleaning the object to be cleaned (Step S12). The bubble generating part may be separated from the loaded place of the object to be cleaned. The bubble generating part may be provided with a first transducer for generating megasonic of high frequency of about 600 KHz or higher. A first power may be applied to the first transducer to generate the megasonic. When the electromotive force is received, the cleaning solution may create the microcavitation bubbles.

In accordance with the application of higher power to the first transducer, higher acoustic pressure may be applied to generate more microcavitation bubbles. To maximize cleaning efficiency, the number of the microcavitation bubbles generated from the bubble generating part should be increased and the first power applied to the first transducer should be increased.

However, as the power applied to the transducer increases, the number of unstable microcavitation bubbles having irregular oscillation also may increase along with the stable microcavitation bubbles having regular oscillation. The first transducer may be disposed along a vertical or horizontal direction with respect to an inflowing direction of the cleaning solution in the bubble generating part.

In accordance with example embodiments, the unstable microcavitation bubbles generated from the bubble generating part may not substantially function to clean the object to be cleaned. Therefore, the first power may be higher than commonly applied power for the bubble generating part that produces microcavitation bubbles. The high power may induce pattern defects on the object to be cleaned when the generated microcavitation bubbles are applied directly to the object.

Among the microcavitation bubbles, stable microcavitation bubbles having periodic oscillation may be moved to a place where the object to be cleaned is placed (step S14). A room where the object to be cleaned is located may be called a cleaning part. In example embodiments, the microcavitation bubbles generated by the first transducer may be outputted through a narrow outlet line and moved to the cleaning part.

During the movement of the microcavitation bubbles from the bubble generation part to the cleaning part, the unstable microcavitation bubbles having short lifetimes may be imploded and removed among the generated microcavitation bubbles from the bubble generating part. Thus, the unstable microcavitation bubbles may not reach the cleaning part where the object to be cleaned is provided. However, the stable microcavitation bubbles having relatively long lifetimes may reach the room where the object to be cleaned is provided. Therefore, only the stable microcavitation bubbles among the microcavitation bubbles generated from the bubble generating part may be selected and moved to the cleaning part.

In this case, the distance from the bubble generating part to the object to be cleaned may be controlled so that some of all of the unstable microcavitation bubbles may be removed while some, all, or most of the stable microcavitation bubbles may reach the object to be cleaned without collapse. A width of the outlet line for outputting the microcavitation bubbles from the bubble generating part, a flowing rate of the outputted microcavitation bubbles, a direction of the inlet line and the outlet line of the cleaning solution from the bubble generating part, a position of the first transducer, etc., may be substantially controlled.

A second power may be provided to the cleaning part to keep the oscillation of the stable microcavitation bubbles that have been transferred to the cleaning part (step S16). In the cleaning part, a second transducer may be provided to apply the second power to keep the oscillation stable. The second transducer may be provided along a vertical direction or a horizontal direction with respect to the forwarding direction of the microcavitation bubbles flowing from the bubble generating part to the cleaning part.

The second power for keeping the stable microcavitation bubbles may not be high enough to generate the microcavitation bubbles. The second power may be lower than the first power. For example, the second power may be 50% or less of the first power.

A pathway of the microcavitation bubbles from the outlet line of the bubble generating part to the object to be cleaned may be filled with the cleaning solution to keep the stable microcavitation bubbles by the second power. The stable microcavitation bubbles may flow within the cleaning solution.

It should be noted that not all of the stable bubbles may be used for cleaning the object to be cleaned as some of the stable bubbles may implode prior to being used in the cleaning operations or may flow around the object to be cleaned without cleaning the object. Thus, in example embodiments, a surface of the object to be cleaned may be cleaned using the cleaning solution including some of the stable bubbles.

The object to be cleaned may be loaded within the tank containing the cleaning solution. Alternatively, the object to be cleaned may not be immersed into the cleaning solution. In this case, the cleaning solution drained out from the outlet line may completely fill the space between the object to be cleaned and an outer and lower surface of a nozzle, so as for the microcavitation bubbles to flow in the cleaning solution.

The object to be cleaned may be cleaned using the stable microcavitation bubbles at the cleaning part (step S18).

In accordance with the above-described example embodiment, the particles attached to the object to be cleaned may be removed using a plurality of stable microcavitation bubbles having periodic oscillation while reducing or preventing the pattern damages of the object.

Various apparatuses for megasonic cleaning having various compositions for implementing the cleaning method may be illustrated. Example embodiments of the apparatuses for megasonic cleaning may be explained hereinafter.

Figure 2:
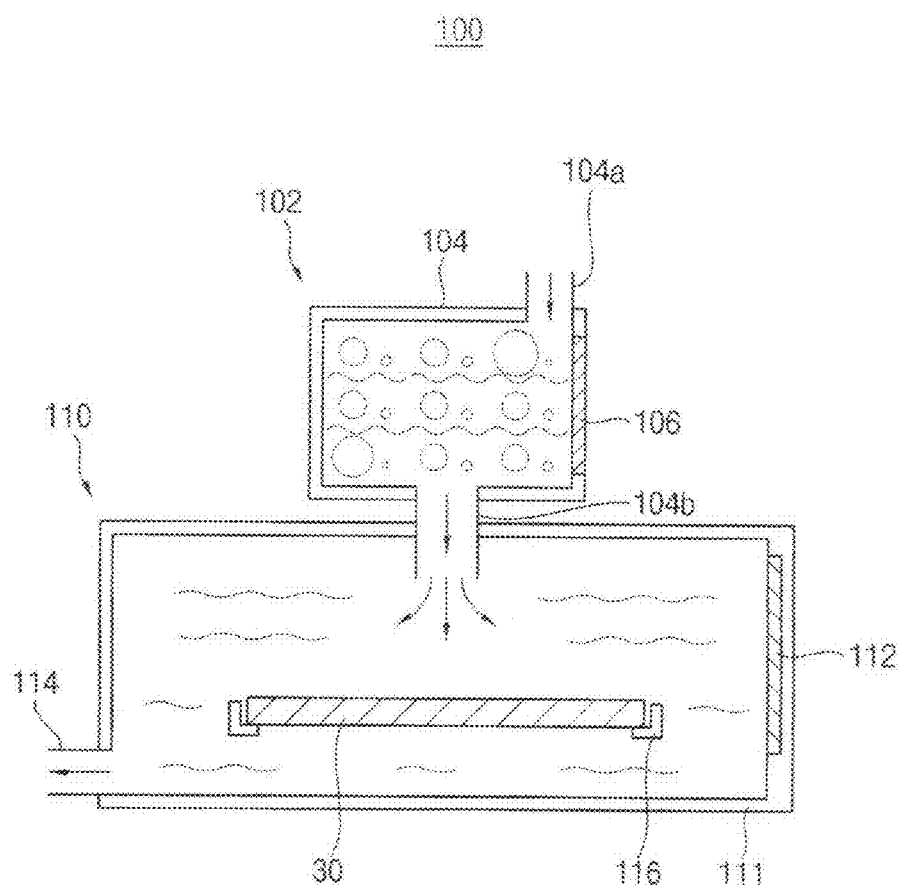

FIG. 2 is a cross-sectional view of an apparatus for performing a megasonic cleaning in accordance with a first example embodiment.

Referring to FIG. 2, a megasonic cleaning apparatus 100 may include a bubble generating part 102 and a cleaning part 110.

The bubble generating part 102 may generate microcavitation bubbles for cleaning an object 30 to be cleaned. The bubble generating part 102 may be filled with a cleaning solution and may include a container 104 having a cleaning solution inlet line 104a and a cleaning solution outlet line 104b and a first transducer 106. The bubble generating part 102 may be positioned at a separate room from a loading part 116 for loading the object 30 to be cleaned.

The cleaning solution may fill the container 104 included in the bubble generating part 102. The inlet line 104a and the outlet line 104b may face each other or be provided vertically to each other. Depending on a position and a diameter of the inlet line 104a and the outlet line 104b, an amount and a flowing rate of the cleaning solution drained out through the outlet line 104b may be controlled.

The cleaning solution may be a solution used for the megasonic cleaning. The cleaning solution may facilitate a removal of particles from a surface of the object 30 to be cleaned and may prevent the particles from re-attaching onto the surface of the object 30 to be cleaned.

The first transducer 106 may be installed in and on an inner surface of the bubble generating part 102 to provide energy for producing the microcavitation bubbles. The first transducer 106 may be installed along a direction parallel or vertical to an extended direction of the inlet line 104a. Microcavitation bubbles may be generated by controlling a position of the first transducer 106.

The cleaning part 110 may be provided separately from the bubble generating part 102. The cleaning part 110 may include a cleaning tank 111 filled with a cleaning solution and a second transducer 112. The cleaning solution that drains from the bubble generating part 102 through the outlet line 104b may fill up the cleaning tank 111. The cleaning solution in the cleaning tank 111 may be the same cleaning solution filling the bubble generating part 102.

The object 30 to be cleaned may be provided in the cleaning tank 111, and a volume of the cleaning tank 111 may be larger than that of the bubble generating part 102. The cleaning tank 111 may include a particle discharging outlet line 114 for discharging particles separated during the cleaning operation.

The second transducer 112 may be provided in the cleaning tank 111 that is filled with the cleaning solution. The second transducer 112 may maintain oscillation of the microcavitation bubbles generated by the first transducer 106. The second transducer 112 may function to maintain a stable oscillation of the stable microcavitation bubbles among the microcavitation bubbles generated by the first transducer 106 and may not generate the microcavitation bubbles. Therefore, power applied to the second transducer 112 may be lower than the power applied to the first transducer 106. The second transducer 112 may be installed in the cleaning tank 111 and on inner surface thereof. The second transducer 112 may be provided along a direction vertical to or parallel to the exhausting direction of the microcavitation bubbles from the bubble generating part 102.

The outlet line 104b of the bubble generating part 102 may be extended to an inside of the cleaning tank 111. The microcavitation bubbles produced from the bubble generating part 102 and the cleaning solution may move through the outlet line 104b to the inner part of the cleaning tank 111.

The outlet line 104b may be designed to select the stable microcavitation bubbles among the microcavitation bubbles generated from the bubble generating part 102 and to guide the stable microcavitation bubbles to the inner part of the cleaning tank 111. A length and a diameter of the outlet line 104b may be optimized so as to transfer only the stable microcavitation bubbles into the cleaning tank 111. A position of the inlet line 104a and the outlet line 104b, an inflowing rate of the cleaning solution into the container, a position of the first and second transducers 106 and 112, etc., may be adjusted to prevent implosion of the stable microcavitation bubbles transferred to the cleaning tank 111 and to keep an oscillation of the stable microcavitation bubbles in the cleaning tank 111.

Among the microcavitation bubbles generated from the bubble generating part 102, stable microcavitation bubbles having relatively long lifetimes may move through the outlet line 104b to the cleaning tank 111 without implosion and nonlinear movement.

The loading part 116 for receiving the object 30 to be cleaned may be provided in the cleaning tank 111. The object 30 to be cleaned loaded on the loading part 116 may be disposed facing a draining part of the cleaning solution from the outlet line 104b, so that the object 30 to be cleaned may be cleaned by the stable microcavitation bubbles. The loading part 116 may be designed so as to horizontally rotate the object 30 to be cleaned. Alternatively, the loading part 116 may be designed so as to move the object 30 to be cleaned horizontally and rectilinear direction.

According to the cleaning apparatus of the present invention, a large number of microcavitation bubbles may be generated from the bubble generating part 102 by applying sufficiently high power to maximize a surface cleaning effect of the object 30 to be cleaned. In addition, only the stable microcavitation bubbles among the microcavitation bubbles generated from the bubble generating part 102 may be utilized for cleaning the object 30 to be cleaned. Therefore, the pattern damages of the object 30 to be cleaned may be restrained.

In accordance with the example embodiments, the bubble generating part 102 may be provided separately from the cleaning tank 111. The bubble generating part 102 may not be immersed into the cleaning solution but only a portion of the outlet line 104b may be immersed into the solution. The bubble generating part 102 may be advantageously maintained and repaired since the bubble generating part is located outside of the cleaning tank 111.

Figure 3:
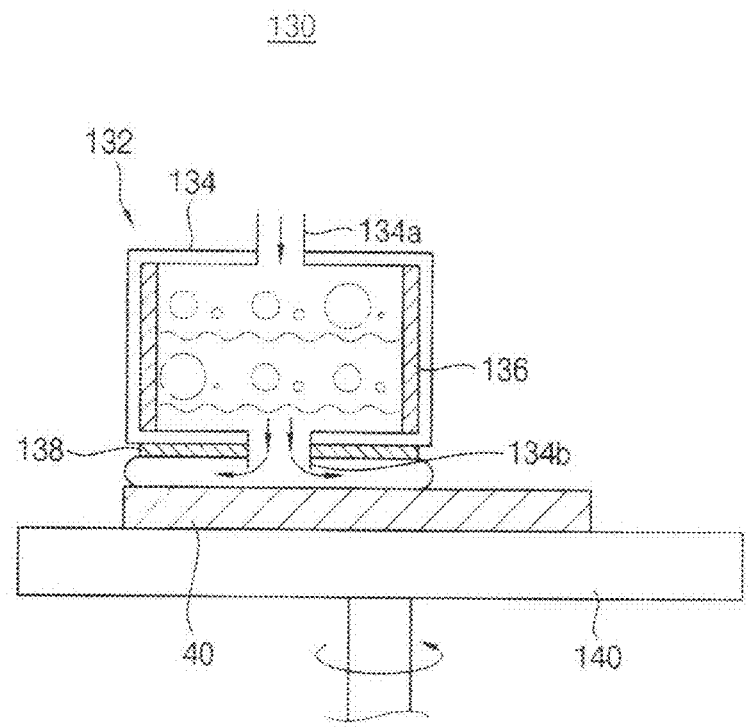

FIG. 3 is a cross-sectional view of an apparatus for performing a megasonic cleaning in accordance with a second example embodiment.

Referring to FIG. 3, a megasonic cleaning apparatus 130 may include a bubble generating part 132, a second transducer 138 and a loading part 140.

The bubble generating part 132 may generate microcavitation bubbles for cleaning an object 40 to be cleaned. The bubble generating part 132 may produce stable microcavitation bubbles together with unstable microcavitation bubbles.

The bubble generating part 132 may include a container or a nozzle containing a cleaning solution for generating bubbles. Since a volume of the bubble generating part 132 may be relatively small, the container may be called as a nozzle 134 in this example embodiment. The bubble generating part 132 may also include a cleaning solution inlet line 134a and a cleaning solution outlet line 134b that are connected to the nozzle 134 and a first transducer 136 for generating the microcavitation bubbles by megasonic action.

The cleaning solution inlet line 134a may be provided at an end portion of the nozzle 134. The cleaning solution inlet line 134a has a smaller diameter or width than that of the nozzle 134. The cleaning solution may be supplied into the nozzle 134 through the cleaning solution inlet line 134a.

The first transducer 136 may be arranged to generate the microcavitation bubbles from the cleaning solution contained in the nozzle 134. When a power is applied to the first transducer 136 disposed in the nozzle 134 having a narrow diameter, a vibration number of a piezoelectric electrode may be further increased and megasonic having a high frequency may be generated.

The first transducer 136 may be disposed in a vertical direction to an inflowing direction of the cleaning solution from the cleaning solution inlet line 134a in FIG. 3. Alternatively, a location of the first transducer 136 may vary within the nozzle 134.

The cleaning solution outlet line 134b may be provided at another end of the nozzle 134. The cleaning solution and the generated microcavitation bubbles may be drained through the cleaning solution outlet line 134b. A diameter of the cleaning solution outlet line 134b may be smaller than that of the nozzle 134. Stable microcavitation bubbles having relatively long lifetimes may be outputted out from the cleaning solution outlet line 134b. A width and a length of the cleaning solution outlet line 134b may be adjusted. In addition, a flowing rate of the cleaning solution also may be controlled.

The cleaning solution inlet line 134a and the cleaning solution outlet line 134b may be provided to face each other in this example embodiment. Alternatively, positions of the cleaning solution inlet line 134a and the cleaning solution outlet line 134b may vary within the bubble generating part 132.

Numbers of the generated microcavitation bubbles and pressure and amount of the cleaning solution may be changed in accordance with positions of the first transducer 136, the cleaning solution inlet line 134a and the cleaning solution outlet line 134b.

The bubble generating part 132 may not include a bath or a cleaning tank having a large volume for containing the cleaning solution in this example embodiment.

The object 40 to be cleaned may be cleaned by the stable microcavitation bubbles outputted from the outlet line 134b at a gap formed between an outer and lower surface of the nozzle 134 and the object 40 to be cleaned.

A second transducer 138 making contact with the outlet line 134b may be provided at the outer and lower surface of the nozzle 134. The second transducer 138 may be disposed in a vertical direction with respect to an extended direction of the outlet line 134b. The second transducer 138 may function to maintain an oscillation of the stable microcavitation bubbles drained from the outlet line 134b.

The oscillation of the microcavitation bubbles may be maintained by the second transducer 138, and the object 40 to be cleaned may be cleaned. For the cleaning, the cleaning solution may fill a gap between the object 40 to be cleaned and the outer and lower surface of the nozzle 134.

The object 40 to be cleaned may not make contact with the outlet line 134b. The gap formed between the object 40 to be cleaned and the outer and lower surface of the nozzle 134 may be relatively narrow. When the gap is narrow enough, the cleaning solution that continuously drains from the outlet line 134b may fill up the gap between the object 40 to be cleaned and the outer and lower surface of the nozzle 134 without any separate container.

A loading part 140 facing the outlet line 134b may load the object 40 to be cleaned. The stable microcavitation bubbles outputted from the outlet line 134b may not spread out onto a whole surface of the object 40 to be cleaned due to the narrow diameter of the outlet line 134b. The loading part 140 may be designed to rotate the object 40 to be cleaned horizontally. Alternatively, the loading part 140 may also be designed to move the object 40 to be cleaned rectilinear and horizontal directions.

In accordance with this example embodiment, the cleaning may be performed using the megasonic energy having a high frequency to obtain an excellent cleaning effect.

Positions of the cleaning solution inlet line, the cleaning solution outlet line and the transducer of the megasonic apparatus may be changed as described above.

Figure 4A:
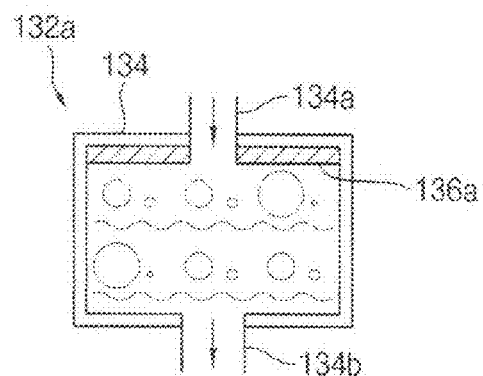
FIGS. 4A to 4C are cross-sectional views illustrating various types of bubble generating parts applicable in the apparatus illustrated in FIG. 3.
Figure 4B:
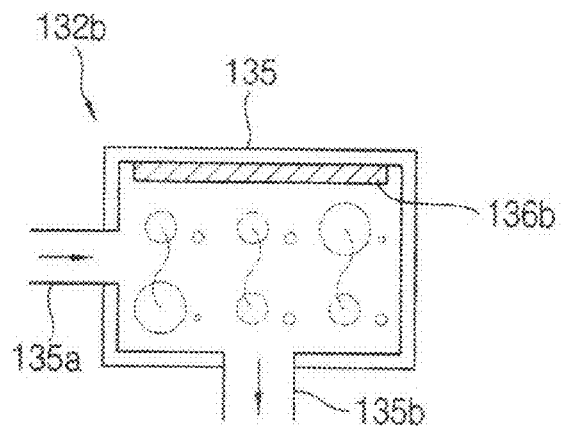
Figure 4C:
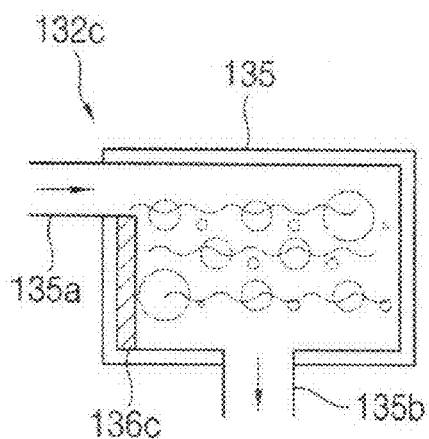

FIGS. 4A to 4C are cross-sectional views illustrating various types of bubble generating parts that are applicable in the apparatus illustrated in FIG. 3. Some embodiments of the megasonic cleaning apparatuses may include one of the bubble generating parts illustrated in FIGS. 4A to 4C.

Referring to FIG. 4A, a bubble generating part 132a may include a cleaning solution inlet line 134a and a cleaning solution outlet line 134b that faces the cleaning solution inlet line 134a, in the same manner as the bubble generating part 132 in FIG. 3. A first transducer 136a may be disposed along a vertical direction to an inflowing direction of the cleaning solution from the cleaning solution inlet line 134a.

Referring to FIG. 4B, a bubble generating part 132b may include a cleaning solution inlet line 135a and a cleaning solution outlet line 135b, which may be offset both horizontally and vertically with respect to cleaning solution inlet line 135a, which is different from the bubble generating part 132 illustrated in FIG. 3. For example, the cleaning solution inlet line 135a may be oriented horizontally and may be attached to a side wall of the bubble generating part 132b and the cleaning solution outlet line 135b may be orientated vertically and may be attached to a lower wall of the bubble generating part 132b, thus the cleaning solution inlet line 135a may be offset both horizontally and vertically with respect to the cleaning solution outlet line 135b. A first transducer 136b may be disposed along the same direction as the inflowing direction of the cleaning solution from the cleaning solution inlet line 135a. Since a volume of the bubble generating part 132b may be relatively small, the container may be called as a nozzle 135 in this example embodiment.

Referring to FIG. 4C, a bubble generating part 132c may include a cleaning solution inlet line 135a and a cleaning solution outlet line 135b, which may be offset both horizontally and vertically with respect to the cleaning solution inlet line 135a, which is different from the bubble generating part 132 illustrated in FIG. 3. For example, the cleaning solution inlet line 135a may be oriented horizontally and may be attached to a side wall of the bubble generating part 132c and the cleaning solution outlet line 135b may be orientated vertically and may be attached to a lower wall of the bubble generating part 132b, thus the cleaning solution inlet line 135a may be offset both horizontally and vertically with respect to the cleaning solution outlet line 135b. A first transducer 136c may be disposed along the vertical direction to the inflowing direction of the cleaning solution from the cleaning solution inlet line 135a. Since a volume of the bubble generating part 132c may be relatively small, the container may be called as a nozzle 135 in this example embodiment.

Figure 5:
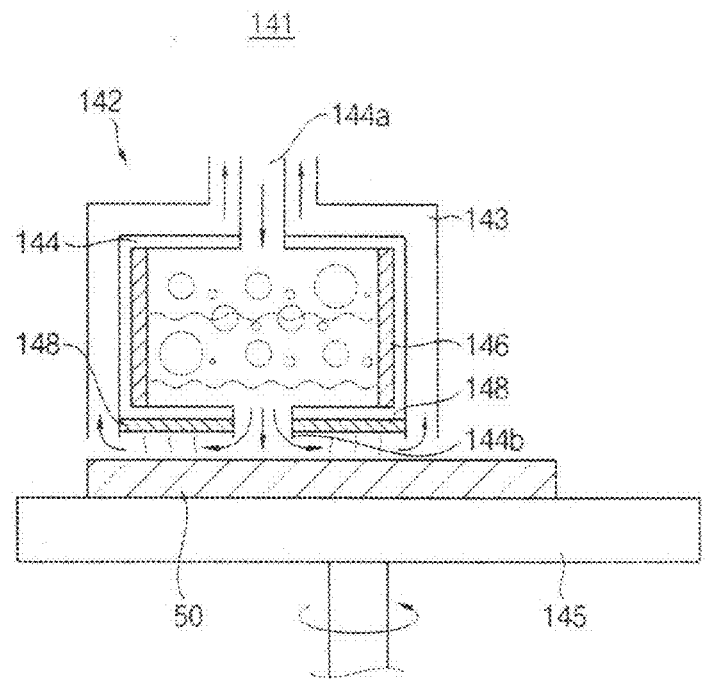

FIG. 5 is a cross-sectional view of an apparatus for performing a megasonic cleaning in accordance with a third example embodiment.

The megasonic cleaning apparatus in accordance with the third example embodiment may include the same components in the apparatus illustrated in the second example embodiment except for further including a particle removing line.

Referring to FIG. 5, a megasonic cleaning apparatus 141 may include a bubble generating part 142, a second transducer 148, a particle discharging line 143 and a loading part 145.

The bubble generating part 142 may produce microcavitation bubbles for cleaning an object 50 to be cleaned. The bubble generating part 142 may include almost the same elements as illustrated in FIG. 3. That is, the bubble generating part 142 may include a nozzle 144, a cleaning solution inlet line 144a, a cleaning solution outlet line 144b and a first transducer 146.

In accordance with the megasonic cleaning apparatus in this example embodiment, the object 50 to be cleaned may be cleaned by stable oscillation of the microcavitation bubbles provided between an outer surface of the nozzle 144 of the bubble generating part 142 and the 50 object to be cleaned. During the cleaning process, the cleaning solution may fill a gap between an outer and lower portion of the nozzle 144 and the object 50 to be cleaned.

The particle exhausting line 143 may make contact with outer sidewalls of the nozzle 144. The particle exhausting line 143 may discharge the cleaning solution including the particles to outside after cleaning the object 50 to be cleaned by the oscillation of the microcavitation bubbles. That is, the cleaning solution including the particles may be drained out.

The particle exhausting line 143 may be extended from an end portion of the outlet line 144b of the bubble generating part 142 to guide the cleaning solution, so that the cleaning solution may fill up the gap between the outer and lower surface of the nozzle 144 and the object 50 to be cleaned. In this case, the particle discharging line 143 may be designed so that the particle discharging line 143 may not make contact with the object 50 to be cleaned.

A second transducer 148 making contact with the outlet line 144b may be provided at an outer surface of the nozzle 144. The second transducer 148 may be disposed horizontally with respect to the outlet line 144b. The second transducer 148 may maintain a stable oscillation of the microcavitation bubbles discharged from the outlet line 144b.

According to another example embodiment, the second transducer 148 may be provided at an outer wall of the particle discharging line 143 (not shown). In this case, the second transducer 148 may face the outlet line 144b. The second transducer 148 may be parallel to the extended direction of the outlet line 144b.

In this example embodiment, the cleaning solution may be guided by the particle discharging line 143. The cleaning solution may easily fill up the gap between the outer and lower portion of the nozzle 144 and the object 50 to be cleaned without any additional container.

The loading part 145 may load the object 50 to be cleaned so as to face the outlet line 144b. The loading part 145 may be designed to make a horizontal rotation and/or perform scanning. Further, the bubble generating part 142 may be designed to perform the scanning.

Figure 6:
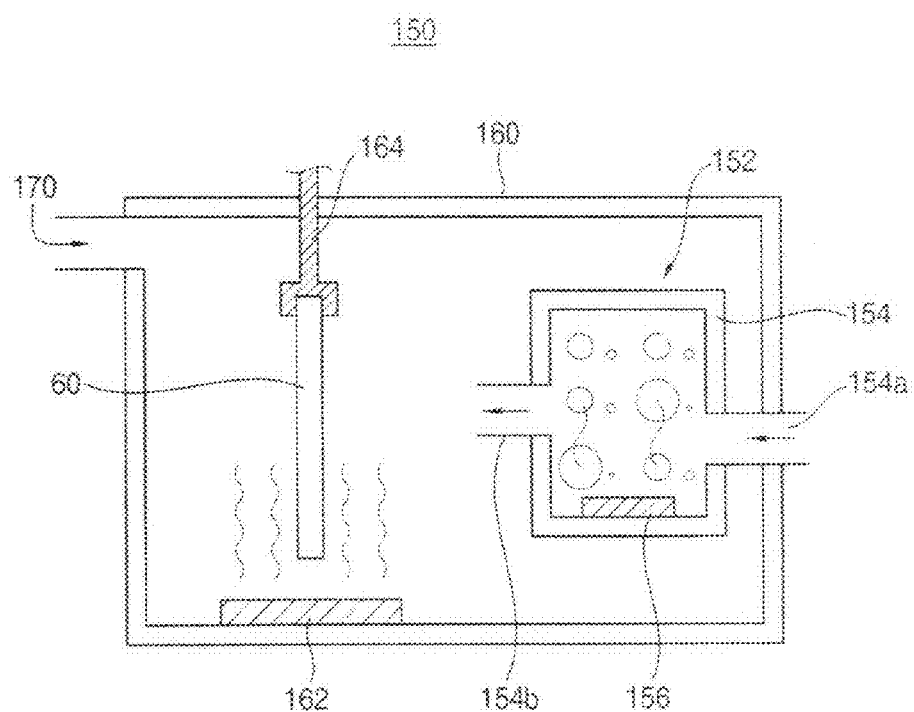

FIG. 6 is a cross-sectional view of an apparatus for performing a megasonic cleaning in accordance with a fourth example embodiment.

Referring to FIG. 6, a megasonic cleaning apparatus 150 may include a cleaning tank 160, a bubble generating part 152, a second transducer 162 and a loading part 164.

The cleaning tank 160 may be filled with a cleaning solution. The cleaning solution may be used for megasonic cleaning. The cleaning solution may facilitate removing of particles and may prevent re-attachment of the particles onto the surface of an object 60 to be cleaned. The object 60 to be cleaned may be disposed in the cleaning tank 160, and the surface of the object 60 to be cleaned may be cleaned using a megasonic cleaning mechanism. The cleaning tank 160 may include the bubble generating part 152 and the loading part 164, and a volume of the tank 160 may be sufficiently large.

The cleaning tank 160 may include a particle discharging line 170 for outputting particles generated during the megasonic cleaning using the microcavitation bubbles. The particle discharging line 170 may be extended to outside of the cleaning tank 160 and separated from the surface of the object 60 to be cleaned.

The bubble generating part 152 may generate microcavitation bubbles for cleaning the object 60 to be cleaned in the cleaning tank 160. The bubble generating part 152 may include a container 154 including an inlet line 154a and an outlet line 154b and a first transducer 156 within the container 154.

Particularly, the container 154 may be provided in the cleaning tank 150. The inlet line 154a connected to the container 154 may be extended to the outside of the cleaning tank 160. Through the inlet line 154a, the cleaning solution may flow from the outside of the cleaning tank 160 into the container 154. A pump may be installed at the cleaning solution inlet line 154a to provide the cleaning solution into the container 154. The cleaning solution outlet line 154b for discharging the cleaning solution into the cleaning tank 150 may be connected to the container 154. The inlet line 154a and the outlet line 154b may be aligned to face each other and in the same direction or may be vertically offset with respect to one another. The diameters of the inlet line 154a and the outlet line 154b may be the same or may be different.

The microcavitation bubbles may be generated from the cleaning solution supplied from the inlet line 154a. The cleaning solution and the oscillation of the microcavitation bubbles may be provided to the cleaning tank 160 through the outlet line 154b.

The second transducer 162 may be provided in the cleaning tank 160. The second transducer 162 may keep the oscillation of the microcavitation bubbles generated by the first transducer 156. The second transducer 162 may not produce the microcavitation bubbles but may keep a stable oscillation of the microcavitation bubbles among the microcavitation bubbles generated by the first transducer 156. Accordingly, a power applied to the second transducer 162 may be lower than a power applied to the first transducer 156. The second transducer 162 may be provided within the cleaning tank 160. The second transducer 162 may be disposed in a vertical direction or horizontal direction with respect to the extended direction of the outlet line 154b. For example, the second transducer 162 may be provided at an inner and bottom portion of the cleaning tank 160 as illustrated in FIG. 6. Alternatively, the second transducer 162 may be provided at an inner and sidewall portion of the cleaning tank 160.

The loading part 164 for fixing the object 60 to be cleaned may be provided in the cleaning tank 160. The object 60 to be cleaned may be cleaned by a stable oscillation of the microcavitation bubbles among the microcavitation bubbles generated from the bubble generating part 152. The loading part 164 may be arranged so that the object 60 to be cleaned may face the outlet line 154b of the bubble generating part 152.

Figure 10:
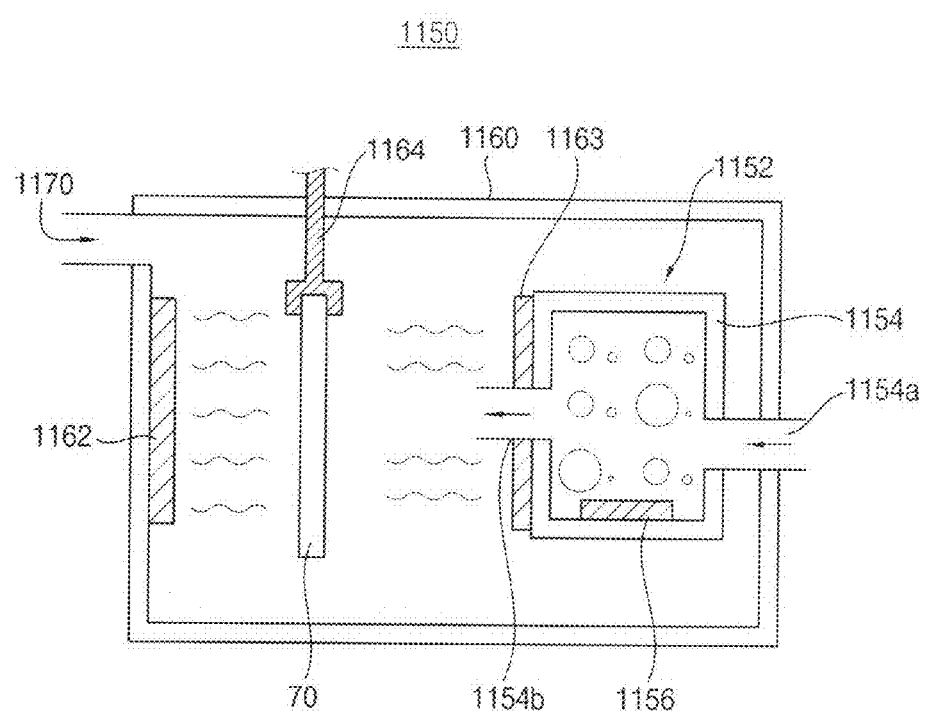
FIG. 10 is a cross-sectional view of an apparatus for performing a megasonic cleaning in accordance with a fifth example embodiment.

FIG. 10 is a cross-sectional view of an apparatus for performing a megasonic cleaning in accordance with a fifth example embodiment.

Referring to FIG. 10, a megasonic cleaning apparatus 1150 may include a cleaning tank 1160, a bubble generating part 1152, a second and third transducers 1162 and 1163, and a loading part 1164.

The cleaning tank 1160 may be filled with a cleaning solution. The cleaning solution may be used for megasonic cleaning. The cleaning solution may facilitate removing of particles and may prevent re-attachment of the particles onto the surface of an object 70 to be cleaned. The object 70 to be cleaned may be disposed in the cleaning tank 1160, and the surface of the object 70 to be cleaned may be cleaned using a megasonic cleaning mechanism. The cleaning tank 1160 may include the bubble generating part 1152 and the loading part 1164, and a volume of the tank 1160 may be sufficiently large.

The cleaning tank 1160 may include a particle discharging line 1170 for outputting particles generated during the megasonic cleaning using the microcavitation bubbles. The particle discharging line 1170 may be extended to outside of the cleaning tank 1160 and separated from the surface of the object 70 to be cleaned.

The bubble generating part 1152 may generate microcavitation bubbles for cleaning the object 70 to be cleaned in the cleaning tank 1160. The bubble generating part 1152 may include a container 1154 including an inlet line 1154a and an outlet line 1154b and a first transducer 1156 within the container 1154.

Particularly, the container 1154 may be provided in the cleaning tank 1150. The inlet line 1154a connected to the container 1154 may be extended to the outside of the cleaning tank 1160. Through the inlet line 1154a, the cleaning solution may flow from the outside of the cleaning tank 1160 into the container 1154. A pump may be installed at the cleaning solution inlet line 1154a to provide the cleaning solution into the container 1154. The cleaning solution outlet line 1154b for discharging the cleaning solution into the cleaning tank 1150 may be connected to the container 1154. The inlet line 1154a and the outlet line 1154b may be aligned to face each other and in the same direction or may be vertically offset with respect to one another. The diameters of the inlet line 1154a and the outlet line 1154b may be the same or may be different.

The microcavitation bubbles may be generated from the cleaning solution supplied from the inlet line 1154a. The cleaning solution and the oscillation of the microcavitation bubbles may be provided to the cleaning tank 1160 through the outlet line 1154b.

The second and third transducers 1162 and 1163 may be provided in the cleaning tank 160. The second and third transducers 1162 and 1163 may keep the oscillation of the microcavitation bubbles generated by the first transducer 1156. The second and third transducers 1162 and 1163 may not produce the microcavitation bubbles but may keep a stable oscillation of the microcavitation bubbles among the microcavitation bubbles generated by the first transducer 1156. Accordingly, a power applied to the second and third transducers 1162 and 1163 may be lower than a power applied to the first transducer 1156. The second and third transducers 1162 and 1163 may be provided within the cleaning tank 160. The second transducer 1162 may be disposed in a vertical direction or horizontal direction with respect to the extended direction of the outlet line 1154b. For example, the second transducer 162 may be provided at an inner and side portion of the cleaning tank 1160 as illustrated in FIG. 10. The third transducer 1163 may be provided on an outer wall of the bubble generating part 1152 as shown in FIG. 10. As illustrated, the second and third transducers 1162 and 1163 may provide energy to the microcavitation bubbles simultaneously on both sides of the object 70 to be cleaned which may allow for a more rapid and uniform cleaning. This example embodiment, however, is not limited thereto. For example only one of the second and third transducers 1162 and 1163 may operate at once rather than both operating simultaneously.

The loading part 1164 for fixing the object 70 to be cleaned may be provided in the cleaning tank 1160. The object 70 to be cleaned may be cleaned by a stable oscillation of the microcavitation bubbles among the microcavitation bubbles generated from the bubble generating part 1152. The loading part 1164 may be arranged so that the object 70 to be cleaned may face the outlet line 1154b of the bubble generating part 1152.

Hereinafter, a cleaning effect in accordance with example embodiments will be explained comparing with the commonly applied cleaning method.

Experiment on Removing Efficiency of Particles by Acoustic Pressure

Using a conventional megasonic transducer, the oscillation of microcavitation bubbles was generated, and the particles attached onto a photomask were removed. A power applied to the conventional megasonic transducer was controlled to obtain various values of acoustic pressure. According to the acoustic pressure, the removing efficiency of the particles was monitored. As the power applied to the conventional megasonic transducer increased, the acoustic pressure also increased. The cleaning was performed without flowing cleaning solution.

Figure 7:
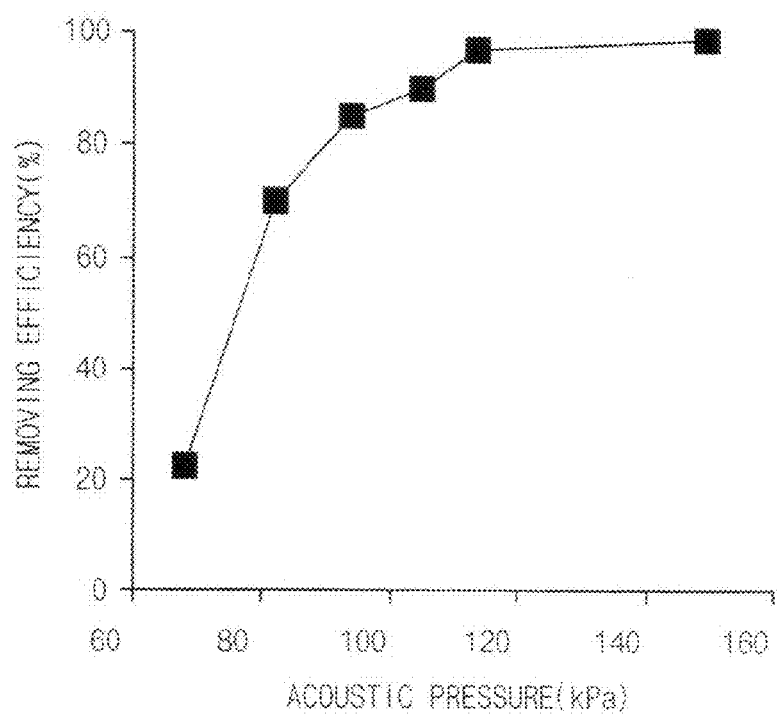

FIG. 7 illustrates a graph showing a removing efficiency of particles in accordance with acoustic pressure.

Referring to FIG. 7, a removing efficiency of the particles was only about 22% at the acoustic pressure value of about 68 kPa. However, a removing efficiency increased to about 97% when the acoustic pressure was increased to about 114 kPa.

According to the result, it was confirmed that a removing efficiency was lowered at a low acoustic pressure while a removing efficiency was increased at a high acoustic pressure. However, when the acoustic pressure increases, the degree of the pattern damage may also increase along with an increase of a removing efficiency of the particles.

Comparative Experiment on Removing Efficiency of Particles

The particles attached onto a photomask were removed by conventional removing methods and by methods in accordance with example embodiments. Thus, obtained results were compared.

A cleaning experiment was performed using the apparatus in accordance with example embodiment 4, illustrated in FIG. 6.

Photomask samples including particles attached thereunto were prepared. A cleaning was performed for each sample by applying a condition as described in the following Table 1.

TABLE 1

| Example No. | Condition |
| --- | --- |
| Comparative Example 1 | A power was not applied to the first and second transducers and a cleaning solution was flowed. |
| Comparative Example 2 | A power was applied to the first transducer to produce an acoustic pressure of about 197 kPa and a cleaning solution was flowed. |
| Comparative Example 3 | A power was applied to the second transducer to produce an acoustic pressure of about 68 kPa and a cleaning solution was stood still. |

TABLE 1-continued

| Example No. | Condition |
| --- | --- |
| Comparative Example 4 | A power was applied to the second transducer to produce an acoustic pressure of about 68 kPa and a cleaning solution was flowed. |
| Example 1 | A power was applied to the first transducer to produce an acoustic pressure of about 114 kPa and to the second transducer to produce an acoustic pressure of about 68 kPa and a cleaning solution was flowed. |

As described above, only one transducer was used or no transducer was used in Comparative Examples 1 to 4 for performing the cleaning process. According to Example 1, both of the first and the second transducers were used to generate an acoustic pressure and the cleaning solution was let to flow.

Figure 8:
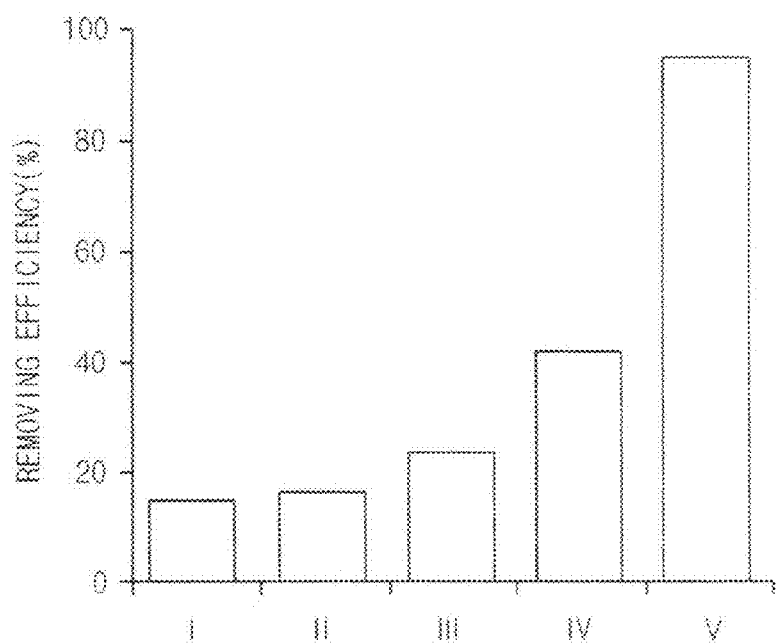

FIG. 8 illustrates bar graphs showing a removing efficiency of particles in accordance with various embodiments. Each bar represents a removing efficiency from the left in accordance with Comparative Example 1 (bar I), Comparative Example 2 (bar II), Comparative Example 3 (bar III), Comparative Example 4 (bar IV) and Example 1 (bar V).

Referring to FIG. 8, the removing efficiency of the particles was about 97% in accordance with Example 1. In the cleaning part where the cleaning process was performed, an acoustic pressure was only 68 kPa in accordance with Example 1. However, a removing efficiency was very high. Since the acoustic pressure was not high in the cleaning part, pattern damage due to the acoustic pressure may be reduced.

On the contrary, a sufficient removing efficiency was not obtainable in accordance with the conventional methods using only one transducer. An acoustic pressure of about 68 kPa in the cleaning part was too low to obtain a sufficient cleaning effect in accordance with the Comparative Example 4.

Experiment on Pattern Damages

Evaluation on damages based on an adhesion force of particles was performed to estimate damages on photomask patterns. In general, the smaller the particles attached to the photomask are, the greater the adhesion force is, and thus the small particles may be hardly removed by the microcavitation bubbles. A size of the particles, which is hard to remove by the microcavitation bubbles, was theoretically calculated and converted. The particles having a mean diameter of about 48 nm were obtained and attached onto a surface of the photomask. When these small particles attached onto the photomask with a high adhesion force, it may be considered that the pattern damage on the photomask was generated since the adhesion force was strong enough to damage the pattern of the photomask.

For the particles having a diameter of about 520 nm, a calculated adhesion torque was about $7 \times 10^{-16}$ Nm and a calculated removal torque applicable by the cavitation bubbles was about $4 \times 10^{-15}$ Nm. Accordingly, the particles having the diameter of about 520 nm were considered as the particles to be removed and the particles having a diameter of about 48 nm were considered to be the patterns formed on the photomask.

Each cleaning experiment was performed using the apparatus in accordance with example embodiment 4, illustrated in FIG. 6. Each sample was manufactured and cleaned according to the following methods described in Table 2.

Sample No. 1 was manufactured by attaching particles having a diameter of about 520 nm onto a photomask. Sample No. 2 was manufactured by attaching particles having a diameter of about 48 nm onto a photomask.

TABLE 2

| Example No. | Condition |
|---|---|
| Comparative Example 5 | A power was applied to the second transducer to produce an acoustic pressure of about 68 kPa and a cleaning solution was flowed. |
| Comparative Example 6 | A power was applied to the second transducer to produce an acoustic pressure of about 197 kPa and a cleaning solution was flowed. |
| Example 2 | A power was applied to the first transducer to produce an acoustic pressure of about 197 kPa and to the second transducer to produce an acoustic pressure of about 68 kPa and a cleaning solution was flowed. |

FIGS. 9A to 9F are fluorescent images of particles on the photomasks taken after performing megasonic cleaning in accordance with various embodiments.

Figure 9A:
Figure 9B:
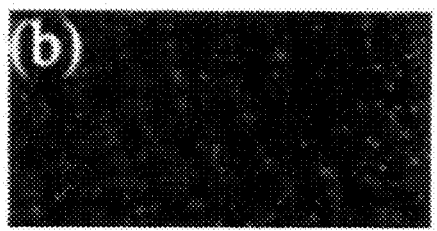
Figure 9C:
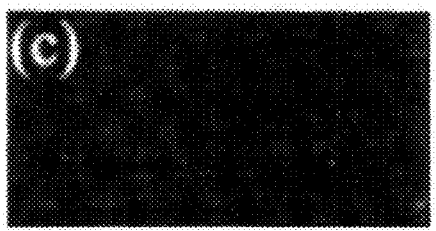

FIGS. 9A to 9C correspond to results obtained using Sample No. 1. FIG. 9A illustrates fluorescent particles before performing a cleaning process. FIG. 9B illustrates remaining fluorescent particles after a cleaning process on the photomask in accordance with Comparative Example 5. FIG. 9C illustrates remaining fluorescent particles after a cleaning process on the photomask in accordance with Example 2.

Referring to FIGS. 9A to 9C, an improved cleaning efficiency was obtainable after a cleaning process of Sample No. 1 in accordance with Example 2 when comparing with the result obtained in accordance with Comparative Example 5.

Figure 9D:
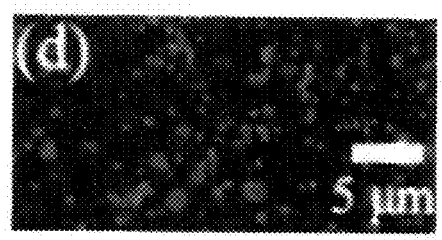
Figure 9E:
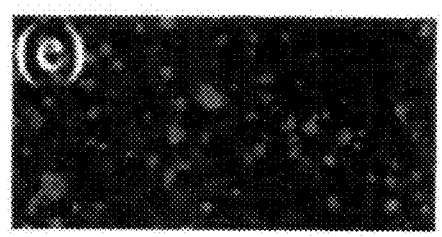
Figure 9F:
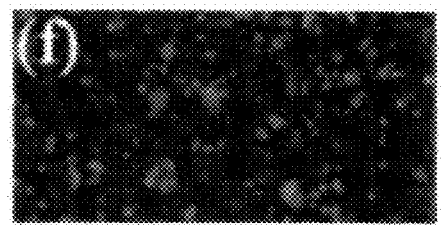

FIGS. 9D to 9F correspond to results obtained using Sample No. 2. FIG. 9D illustrates fluorescent particles before performing the cleaning process. FIG. 9E illustrates remaining fluorescent particles after cleaning process on the photomask in accordance with Comparative Example 6. FIG. 9F illustrates remaining fluorescent particles after cleaning process on the photomask in accordance with Example 2.

Referring to FIGS. 9D to 9F, almost all of the particles having a diameter of about 48 nm were not removed but remained after a cleaning process of Sample No. 2 in accordance with Example 2. When comparing with the result obtained after a cleaning process of Sample No. 2 in accordance with Comparative Example 6, more particles were observed in FIG. 9F. Accordingly, the pattern damage of an object to be cleaned including a substrate or a photomask may be reduced when performing a megasonic cleaning process in accordance with the example embodiments.

According to example embodiments, an object to be cleaned may be cleaned by the megasonic cleaning method. A particle removing efficiency may be high and pattern damage may be reduced. The cleaning method and the apparatus in accordance with example embodiments may be applicable to various parts including a semiconductor substrate, a photomask, electronic parts and minute products.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of megasonic cleaning comprising:
providing a bubble generating part including a container, the container having an inlet line through which a cleaning solution enters the bubble generating part and an outlet line through which the cleaning solution passes;
providing a cleaning part in communication with the bubble generating part, the cleaning part provided separately from the bubble generating part, the bubble generating part being positioned vertically above the cleaning part;
forming microcavitation bubbles in the container of the bubble generating part by applying an electromotive force to the cleaning solution using a megasonic energy, the microcavitation bubbles including stable bubbles of a stable oscillation state and unstable bubbles, the megasonic energy being generated by providing a first power;
moving the cleaning solution including the stable and unstable bubbles through the outlet line of the bubble generating part and into the cleaning part;
providing a second power into the cleaning part where an object is provided so that the stable bubbles that have moved to the cleaning part maintain the stable oscillation state; and
cleaning a surface of the object in the cleaning part using the cleaning solution including at least some of the stable bubbles.

2. The method of claim 1, wherein the moving the cleaning solution moves the cleaning solution such that at least some of the unstable bubbles are collapsed or removed during the movement of the cleaning solution.

3. The method of claim 1, wherein the first power is higher than the second power.

4. The method of claim 1, wherein the second power is less than 50% of the first power.

5. A method of megasonic cleaning comprising:
providing a bubble generating part including a container, the container having an inlet line through which a cleaning solution enters the bubble generating part and an outlet line through which the cleaning solution passes;
providing a cleaning part in communication with the bubble generating part, the cleaning part provided separately from the bubble generating part, the bubble generating part being positioned vertically above the cleaning part;
forming microcavitation bubbles in the container of the bubble generating part by applying an electromotive force to the cleaning solution using a megasonic energy, the microcavitation bubbles including stable bubbles of a stable oscillation state and unstable bubbles;
moving the cleaning solution including the stable and unstable bubbles through the outlet line of the bubble generating part and into the cleaning part;
providing the cleaning solution into the cleaning part so that the stable bubbles that have moved to an object maintain the stable oscillation state, the cleaning part being filled with the cleaning solution; and
cleaning a surface of the object in the cleaning part using the cleaning solution including at least some of the stable bubbles.

6. The method of claim 5, wherein the moving the cleaning solution moves the cleaning solution such that at least some of the unstable bubbles are collapsed or removed during the movement of the cleaning solution.

7. The method of claim 5, wherein:
- a first power for producing the microcavitation bubbles is provided in the bubble generating part; and
- a second power for keeping an oscillation of the stable bubbles is provided in the cleaning part where the object is provided.

8. The method of claim 5, wherein the first power is higher than the second power.

9. The method of claim 8, wherein the second power is less than 50% of the first power.

* * * * *